United States Patent [19]

Anthony et al.

[11] Patent Number: 5,419,276
[45] Date of Patent: * May 30, 1995

[54] SINGLE-CRYSTAL DIAMOND OF VERY HIGH THERMAL CONDUCTIVITY

[75] Inventors: Thomas R. Anthony, Schenectady; William F. Banholzer, Glenville; James F. Fleischer, Scotia; James W. Bray, Schenectady; Jerome J. Tiemann, Schenectady; Laurence Bigio, Schenectady, all of N.Y.

[73] Assignee: General Electric Company, Worthington, Ohio

[*] Notice: The portion of the term of this patent subsequent to May 10, 2011 has been disclaimed.

[21] Appl. No.: 163,608

[22] Filed: Dec. 6, 1993

Related U.S. Application Data

[63] Continuation of Ser. No. 798,063, Oct. 28, 1991, abandoned, which is a continuation of Ser. No. 536,371, Jun. 11, 1990, abandoned, which is a continuation-in-part of Ser. No. 448,469, Dec. 11, 1989, abandoned.

[51] Int. Cl.⁶ ............................................. C30B 29/04
[52] U.S. Cl. ..................................... 117/86; 423/446; 117/929
[58] Field of Search ......................... 423/446; 501/86; 117/79, 86, 929

[56] References Cited

U.S. PATENT DOCUMENTS

| | | | |
|---|---|---|---|
| 3,895,313 | 7/1975 | Seitz | 423/446 |
| 4,034,066 | 7/1977 | Strong et al. | 423/446 |
| 4,073,380 | 2/1978 | Strong et al. | 423/446 |
| 4,434,188 | 2/1984 | Kamo et al. | 423/446 |
| 4,544,540 | 10/1985 | Tsuji | 156/DIG. 68 |
| 4,617,181 | 10/1986 | Yazu et al. | 423/446 |
| 4,816,286 | 3/1989 | Hirose | 423/446 |

FOREIGN PATENT DOCUMENTS

| | | | |
|---|---|---|---|
| 206820 | 6/1986 | European Pat. Off. | 423/446 |
| 58-110494 | 7/1983 | Japan | 423/446 |
| 60-112699 | 6/1985 | Japan | 423/446 |
| 60-118694 | 6/1985 | Japan | 501/86 |
| 60-121271 | 6/1985 | Japan | 501/86 |

OTHER PUBLICATIONS

Stromberg et al. "Sintering of Diamond at 1800° C.-1900° C. and 60-65 KBar", American Ceramic Bulletin, vol. 49, No. 12, (1970) pp. 1030-1032.

Clancy, The Cardinal of the Kremlin, (Barkley Books, Copyright Jul. 1988), pp. 112-113.

Davies, Diamond (Bristol England: Adam Hilger Ltd.), 1989, p. 138.

Seitz, "Isotopic Enhancement of Thermal Conductivity and Damage Thresholds in Diamond" Papers given Feb. 6, 1987, at Lincoln Laboratories.

Primary Examiner—Robert M. Kunemund

[57] ABSTRACT

Single-crystal diamond consisting of isotopically pure carbon-12 or carbon-13 has been found to have a thermal conductivity higher than that of any substance previously known, typically at least 40% higher than that of naturally occurring IIA diamond. It may be prepared by a method comprising comminution of diamond of high isotopic purity, such as that obtained by low pressure chemical vapor deposition employing an isotopically pure hydrocarbon in combination with hydrogen, followed by conversion of the comminuted diamond to single-crystal diamond under high pressure conditions.

15 Claims, No Drawings

SINGLE-CRYSTAL DIAMOND OF VERY HIGH THERMAL CONDUCTIVITY

This is a continuation of Ser. No. 07/798,063 filed on Oct. 28, 1991, now abandoned, which is a continuation of Ser. No. 07/536,371 filed on Jun. 11, 1990, now abandoned, which is a continuation-in-part of Ser. No. 07/448,469 filed on Dec. 11, 1989 also abandoned.

This invention relates to the preparation of single crystal diamond of extremely high thermal conductivity.

Diamond substances with high thermal conductivity are known in the art. For example, type IIA natural diamond, characterized by a very high degree of purity, has a thermal conductivity at 25° C. (298° K.) on the order of 21 watts/cm.°K., the highest of any material known prior to the present invention. Its electrical conductivity, on the other hand, is so low as to be negligible.

These properties make diamond an excellent material for conducting heat away from heat-generating objects or units. It may be used as a heat sink or as a conductor/spreader to conduct heat from the heat-generating object or unit to a heat sink of some other material.

Various areas exist in which heat conductors of very high thermal conductivity are necessary. One example is in repeating stations for fiber optic networks. Signals are transmitted by laser light over the fibers of such networks for very great distances. Since these signals decrease substantially in intensity over several kilometers, it is necessary to construct "repeating stations" periodically along the network, for the purpose of increasing the intensity of the light transmitted along the network. In a typical repeating station of this type, a photodetector is employed to convert the weakened signal transmitted by fiber optics to an electrical signal, which is then magnified, reconverted to a light signal by a light-emitting diode, and transmitted in turn along the next segment of the network.

In order to minimize the requisite number of repeating stations, optimum magnification of the signal in any station is desirable. However, the amount of radiant energy of any kind generated electrically is proportional to the fourth power of the current employed. While a portion of such radiant energy is in the form of light, the remainder thereof is lost as heat. In any individual station, therefore, very large amounts of heat are generated, requiring efficient heat conductors to maintain the operativeness of the repeating station.

The use of natural type IIA diamond as a conductor of heat in these areas has not been foreclosed despite its very high cost since the operative heat-conducting units are very small, typically about 1 mm. on a side. When larger heat-conducting elements are required, expense considerations become important and the use of natural diamond may accordingly be foreclosed.

Conventionally produced high-pressure synthetic diamond of gem quality is lower in cost than natural diamond. However, synthetic diamond of this type having high thermal conductivity cannot effectively be produced directly from graphite because a profound contraction in volume occurs in the conversion and introduces imperfections into the crystalline structure. For the most part, diamond prepared by low-pressure chemical vapor deposition (hereinafter sometimes "CVD") processes are not single crystal diamond and have substantially lower thermal conductivities, typically on the order of 12 watts/cm.°K. at about 300° K. (hereinafter sometimes "room temperature conductivity").

In U.S. Pat. No. 3,895,313, there are disclosed various diamond materials which allegedly have very high thermal conductivities, and which allegedly are useful as optical elements for very high-power laser beams. In particular, it is stated that synthetic diamond grown from isotopically pure carbon-12 or carbon-13 would be useful in this way, with room temperature conductivity values in the range of 10–20 watts/cm.°K. being mentioned. This is, of course, the order of magnitude of natural type IIA diamond and also of diamond produced by chemical vapor deposition. It is further suggested that at a temperature of 70° K. (−203° C.), below the temperature of liquid nitrogen, a thermal conductivity exceeding 200 watts/cm.°K. may be obtained, perhaps in diamond which has high isotopic purity and "relevant properties which closely approach the limits predicted by the theory of the perfect solid state" (i.e., are in single-crystal form). However, no methods for the preparation of such diamond are suggested, and the state of the art has hitherto been inadequate to put them in the possession of the public.

The present invention provides a method for preparing single-crystal diamond of very high chemical and isotopic purity. The raw material for such diamond is itself diamond, which eliminates the volume contraction encountered in the high-pressure conversion of graphite to diamond. The thermal conductivity of the diamond so produced has been found to be higher than that of any substance presently known including natural type IIA diamond, and also higher than the values in the aforementioned U.S. Pat. No. 3,895,313. Accordingly, it is eminently suitable for use as a conductor of heat and also in numerous other areas.

In one of its aspects, the invention is a method for preparing single-crystal diamond of high isotopic purity which comprises the steps of:

(A) preparing diamond consisting of isotopically pure carbon-12 or carbon-13; and (B) converting said diamond to single-crystal diamond by diffusion under high pressure through a metallic catalyst-solvent material to a region containing a diamond seed crystal.

An essential feature of the method of this invention is the employment of isotopically pure carbon-12 or carbon-13. As explained hereinafter, it has been found that the increase in thermal conductivity resulting from the employment of chemically and isotopically pure carbon is vastly greater than would be expected based on theoretical considerations. In general, the isotopic purity of the hydrocarbon should be at least 99.2% by weight; that is, the other isotope should be present in a maximum amount of 8 parts per 1000. An isotopic purity of at least 99.9% by weight is preferred. The hydrocarbon should also have a high degree of chemical purity.

Various methods may be employed in step A for the preparation of diamond in isotopically pure form. For example, a gaseous carbon compound such as carbon monoxide may be separated into carbon-12 and carbon-13 species via differences in diffusivity and then converted to solid carbon by art-recognized means, such as combustion in a reducing flame in the case of carbon monoxide. The carbon thus formed may then be converted to diamond under conventional conditions, including high temperature and high pressure conditions or CVD conditions.

Alternatively, other methods may be employed including shock formation and CVD processes under conditions which produce a mixture of diamond and graphite. In processes of the latter type, the carbon-13 species will concentrate in the diamond phase and the carbon-12 species in the graphite phase. Other diamond precursors which may be employed in enriched form include pyrolytic graphite, amorphous or glassy carbon, liquid hydrocarbons and polymers.

It is usually found that conventional methods of CVD diamond formation are most convenient for the preparation of isotopically pure diamond. In such methods, a layer of diamond is deposited on at least one substrate. Any substrate material suitable for diamond deposition thereon may be employed; examples of such materials are boron, boron nitride, platinum, graphite, molybdenum, copper, aluminum nitride, silver, iron, nickel, silicon, alumina and silica, as well as combinations thereof. Metallic molybdenum substrates are particularly suitable under many conditions and are often preferred.

The method of chemical vapor deposition of diamond on a substrate is known, and the details need not be repeated herein. In brief, it requires high-energy activation of a mixture of hydrogen and a hydrocarbon, typically methane, whereupon the hydrogen gas is converted to atomic hydrogen which reacts with the hydrocarbon to form elemental carbon. Said carbon then deposits on the substrate in the form of diamond. Activation may be achieved by conventional means involving high-energy activation which produces atomic hydrogen from molecular hydrogen; such means include thermal means typically involving heated filaments, flame means, D.C. discharge means and radiation means involving microwave or radio-frequency radiation or the like.

Thermal and especially filament methods, employing one or more resistance heating units including heated wires or filaments, are often preferred for the purposes of this invention. In such methods, the filaments are typically of metallic tungsten, tantalum, molybdenum and rhenium; because of its relatively low cost and particular suitability, tungsten is often preferred. Filament diameters of about 0.2–1.0 mm. are typical, with about 0.8 mm. frequently being preferred. Distances from filaments to substrate(s) are generally on the order of 5–10 mm.

Said filaments are typically heated at temperatures of at least 2000° C. and the optimum substrate temperature is in the range of 900°–1000° C. The pressure in the deposition vessel is maintained up to about 760 torr, typically on the order of 10 torr. The hydrogen-hydrocarbon mixture generally contains hydrocarbon in an amount up to about 2% by volume based on total gases. For a description of illustrative CVD methods of diamond preparation, reference is made to copending, commonly owned applications Ser. Nos. 07/389,210 and 07/389,212.

Isotopically pure hydrocarbon is employed in the CVD method, when used. In order to avoid contamination thereof, it is essential to employ equipment which does not contain natural carbon as an impurity. For this purpose, the CVD chamber should be constructed of materials substantially incapable of dissolving carbon. Typical materials of this type are quartz and copper.

As between carbon-12 and carbon-13, the former is usually preferred for various reasons. In the first place, carbon-12 is present in nature in much higher proportions than carbon-13, the latter typically occurring in amounts no higher than about 1% by weight; therefore, the use of carbon-12 involves minimum expense. In the second place, thermal conductivity is inversely proportional to the square of the mass number of the isotope, and diamond prepared from carbon-12 can therefore be expected to have a thermal conductivity about 17% greater than those prepared from carbon-13. In some applications, however, carbon-13 is preferred and its preparation and use are part of the invention.

The thickness of the CVD diamond layer deposited on the substrate is not critical. In general, it is convenient to deposit at least as much diamond as will be needed to produce a single crystal of the desired size. Of course, the production of a larger amount of CVD diamond for use to make several crystals is also contemplated.

It is possible to convert the product of the CVD process directly to diamond of high thermal conductivity by high pressure means, as described hereinafter, employing the same in the form of a slab, sheet or broken pieces thereof. However, the method of this invention is most efficiently conducted if the isotopically pure diamond is first comminuted.

Comminution may be achieved by art-recognized means such as crushing and powdering. The particle size thereof is not critical so long as a sufficient degree of comminution is attained; the form known in the art as "grit diamond" is suitable.

Step B, the production of single crystal diamond, is conventional except that the isotopically pure diamond produced in step A is the raw material employed. Two things are achieved by using diamond rather than graphite or some other allotrope of carbon as the raw material: an easily obtained isotopically pure material may be employed, and the contraction in volume encountered in the conversion of graphite and other allotropes to diamond is avoided, permitting production of a single crystal of regular structure and high quality.

The process for producing single-crystal diamond under high pressure is also known in the art, and a detailed description thereof is not deemed necessary. Reference is made, for example, to *Encyclopedia of Physical Science & Technology*, vol. 6, pp. 492–506 (Academic Press, Inc., 1987); Strong, *The Physics Teacher*, January 1975, pp. 7–13; and U.S. Pat. Nos. 4,073,380 and 4,082,185, for general descriptions of the process. It generally involves diffusion of the carbon employed as a source material through a liquid bath of a metallic catalyst-solvent material, at pressures on the order of 50,000–60,000 atmospheres and temperatures in the range of about 1300°–1500° C. A negative temperature gradient, typically of about 50° C., is preferably maintained between the material being converted and the deposition region, which contains a diamond seed on which crystal growth can begin.

Catalyst-solvent materials useful in step B are known in the art. They include, for example, iron; mixtures thereof with nickel, aluminum, nickel and cobalt, nickel and aluminum, and nickel, cobalt and aluminum; and mixtures of nickel and aluminum. Iron-aluminum mixtures are frequently preferred for the production of single-crystal diamond, with a material consisting of 95% (by weight) iron and 5% aluminum being particularly preferred for the purposes of the invention.

Following preparation of the single-crystal diamond by the method of this invention, it is often preferred to remove the portion attributable to the seed crystal by polishing. This is particularly true if the seed crystal is not isotopically pure.

Studies on single-crystal diamond prepared according to the invention and having various degrees of isotopic purity have shown that at carbon-12 purity levels of 99.2%, 99.5% and 99.9% by weight, the room temperature conductivities are, respectively, 10%, 25% and 40% greater than that of natural type IIA diamond. At lower temperatures, even higher differences in thermal conductivity are to be expected. Such thermal conductivities are higher than those of any material previously known. Single-crystal diamond of this type is another aspect of the invention, as is diamond prepared by the method described herein.

The reasons for the extremely high thermal conductivity of the single-crystal diamond of this invention are not fully understood. It is assumed, however, that the phenomenon is principally a function of the mean free path of the phonons (i.e., lattice vibration modes) in the diamond crystals. Thermal conductivity is directly proportional to specific heat, sound velocity in and phonon mean free path of the crystal, and isotope effects on specific heat and sound velocity are negligible.

In a simplified calculation, the reciprocal of the phonon mean free path can be considered as equal to the sums of the reciprocals of the mean free paths attributable to phonon-phonon scattering and to isotope effects. It has been calculated that the isotope-related mean free path is 34,000 Angstroms and the phonon scattering-related path is 1900 Angstroms; consequently, the isotope effect would account for a decrease in mean free path on the order of only about 5.2%. One possible reason for the substantially greater observed isotope effect on thermal conductivity is that contrary to theory, the isotopic constitution of the diamond has a direct effect on the mean free path attributable to phonon-phonon scattering. This effect has apparently not been previously recognized.

By reason of the aforementioned high thermal conductivity value and essentially non-existent electrical conductivity, the isotopically pure single crystal diamond of the present invention is singularly useful as a conductor of heat from electronic devices and similar heat-generating sources. Articles comprising such a source in contact with said diamond as a thermal conductor are another aspect of the invention.

A further aspect is abrasive articles comprising said diamond. Such articles can be expected to have extraordinarily long life by reason of their ability to dissipate frictional heat generated during their use. Typical areas of application include abrasive grit, diamond compacts, wire drawing dies, saw blades, scribing tools, drills, tool sharpeners, and polishing tools for optical items, stone and precious stones including diamonds and articles made therefrom.

Still another aspect is light-filtering articles comprising said diamond with a pinhole aperture therein. They are useful, for example, as spatial filters for laser beams and the like. Articles of this type fabricated from natural diamond are subject to radiation-induced damage, probably thermal in nature. The substantially higher thermal conductivity of the diamond of this invention may be expected to greatly minimize damage of this kind.

The invention is illustrated by an example in which a layer of CVD diamond was first deposited on a molybdenum substrate in a chamber constructed of quartz and copper, neither of which dissolves substantial amounts of carbon. The substrate was vertically disposed in a plane parallel to and 8–9 mm. distant from the plane of a tungsten filament about 0.8 mm. in diameter. The vessel was evacuated to a pressure of about 10 torr, the filament was heated to about 2000° C. by passage of an electric current and a mixture of 98.5% (by volume) hydrogen and 1.5% methane was passed into the vessel. The methane employed was substantially impurity-free and 99.9% thereof contained the carbon-12 isotope. Upon removal and mass spectroscopic analysis of the diamond thus obtained, it was found that 99.91% of the carbon therein was carbon-12.

Thermal conductivity of the isotopically pure CVD diamond was measured by the mirage detection of thermal waves generated by a modulated argon-ion beam impinging on the diamond crystals, in accordance with a conventional method. The room temperature conductivity was shown to be about 12 watts/cm.°K. A control sample of similar CVD diamond prepared from methane having the naturally occurring isotope distribution (98.96% C-12, 1.04% C-13) had essentially the same conductivity.

The isotopically pure CVD diamond was crushed and powdered, and was used as a source of carbon for the growth of a single-crystal diamond under high pressure and high temperature conditions. Specifically, a conventional belt apparatus was employed at 52,000 atmospheres and 1400° C., employing a catalyst-solvent mixture of 95% (by weight) iron and 5% aluminum. A small (0.005 carat) single-crystal diamond seed of normal isotopic distribution was used to initiate growth, and a negative temperature gradient of about 50° C. was maintained between the CVD diamond and the seed crystal. The process was continued until a single crystal of 0.95 carat had been produced. It was shown by analysis that 99.93% of the carbon therein was the C-12 isotope.

The diamond was polished on a standard diamond scaife to remove the seed crystal, and its room temperature conductivity was compared with those of several other materials, including a control single-crystal diamond prepared from the CVD diamond with normal isotope distribution. The results were as follows, all values being in watts/cm.°K.:

| | |
|---|---|
| Isotopically pure C-12 diamond (this invention) | 31.5 |
| Control | 21.18 |
| Naturally occurring type IIA diamond | 21.2 |
| CVD diamond | 12.0 |
| Cubic boron nitride | 7.6 |
| Silicon carbide | 4.9 |
| Copper | 4.0 |
| Beryllium oxide | 3.7 |
| Boron phosphide | 3.6 |
| Aluminum nitride | 3.2 |
| Silicon | 1.6 |
| Aluminum oxide | 0.2 |

Thus, the room temperature conductivity of the diamond of this invention is 48.7% greater than that of the control. It is also much higher than the room temperature conductivity of any other diamond or non-diamond material which has been measured.

At 70° K., below the boiling point of liquid nitrogen, the diamond of the present invention is theoretically predicted to have a conductivity of about 2675 watts/cm.°K., more than 13 times the minimum value predicted in the aforementioned U.S. Pat. No. 3,895,313.

What is claimed is:

1. A method for preparing single-crystal diamond of high isotopic purity having a thermal conductivity of at least 31.5 watts/cm.°K. at 300° K. which comprises the steps of:
   (A) preparing diamond consisting of isotopically pure carbon-12 or carbon-13 by depositing diamond on a substrate by chemical vapor deposition from a low pressure gas mixture consisting of isotopically pure carbon-12 or carbon-13 as a source of hydrocarbon, said deposited diamond being isotopically pure and having thermal conductivity of at least 12; and comminuting said deposited diamond to grit diamond;
   (B) converting said grit diamond to single crystal diamond by diffusion under high pressure through a metallic catalyst-solvent material to a region containing a diamond seed crystal.

2. A method according to claim 1 wherein the carbon in the hydrocarbon is carbon-12.

3. A method according to claim 1 wherein the carbon in the hydrocarbon is at least 99.2% isotopically pure.

4. A method according to claim 3 wherein the diamond of step A is prepared by chemical vapor deposition.

5. A method according to claim 4 wherein the equipment employed in step A is constructed of materials substantially incapable of dissolving carbon.

6. A method according to claim 4 wherein step A is conducted at a filament temperature of at least 2000° C., a substrate temperature in the range of 900°–1000° C. and a pressure of about 10 torr.

7. A method according to claim 6 wherein the filaments are of tungsten and the substrate is molybdenum.

8. A method according to claim 5 wherein the carbon in the hydrocarbon is at least 99.9% isotopically pure.

9. A method according to claim 8 wherein the catalyst-solvent material employed in step B is an iron-aluminum mixture.

10. A method according to claim 9 wherein a negative temperature gradient is maintained in step B between the material being converted and the deposition region.

11. A method according to claim 10 wherein the catalyst-solvent material employed in step B is a mixture of 95% iron and 5% aluminum by weight.

12. A method according to claim 11 wherein the temperature gradient is about 50° C.

13. A method according to claim 10 wherein the pressure in step B is in the range of 50,000–60,000 atmospheres and the temperature is in the range of about 1300°–1500° C.

14. A method according to claim 13 wherein the seed crystal is single-crystal diamond of normal isotopic distribution.

15. A method according to claim 14 wherein the portion of the product diamond attributable to the seed crystal is removed by polishing.

* * * * *